(12) United States Patent
Park

(10) Patent No.: US 7,772,719 B2
(45) Date of Patent: Aug. 10, 2010

(54) THRESHOLD VOLTAGE CONTROL CIRCUIT AND INTERNAL VOLTAGE GENERATION CIRCUIT HAVING THE SAME

(75) Inventor: Sang Il Park, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 160 days.

(21) Appl. No.: 12/012,938

(22) Filed: Feb. 5, 2008

(65) Prior Publication Data

US 2009/0108675 A1 Apr. 30, 2009

(30) Foreign Application Priority Data

Oct. 29, 2007 (KR) .................. 10-2007-0109124

(51) Int. Cl.
 *H02J 1/10* (2006.01)
(52) U.S. Cl. ......................................... 307/43; 307/86
(58) Field of Classification Search .................. 307/43, 307/80, 86; 327/538, 543
 See application file for complete search history.

(56) References Cited

U.S. PATENT DOCUMENTS

| 2004/0183114 A1 | 9/2004 | Eshel |
| 2005/0200401 A1* | 9/2005 | Jang ............................ 327/538 |

FOREIGN PATENT DOCUMENTS

| KR | 10-2002-0053493 A | 7/2002 |
| KR | 10-2005-0091234 A | 9/2005 |

* cited by examiner

*Primary Examiner*—Albert W Paladini
*Assistant Examiner*—Carlos Amaya
(74) *Attorney, Agent, or Firm*—John P. White; Cooper & Dunham LLP

(57) ABSTRACT

A threshold voltage control circuit includes a first voltage supplying unit for supplying a first power supply voltage, in response to an enable signal which is activated when a bank is enabled, as a back bias voltage of a first MOS transistor, wherein the first MOS transistor drives an internal voltage, and a second voltage supplying unit for supplying a second power supply voltage, in response to the enable signal, as the back bias voltage of the first MOS transistor.

16 Claims, 4 Drawing Sheets

THRESHOLD VOLTAGE CONTROL CIRCUIT AND INTERNAL VOLTAGE GENERATION CIRCUIT HAVING THE SAME

BACKGROUND

The present disclosure relates to an internal voltage generation circuit and, more particularly, to a threshold voltage control circuit capable of controlling a current drivability of an internal voltage driver and a stable internal voltage generation circuit using the same.

Generally, a semiconductor memory device uses a power supply voltage VDD and a ground voltage VSS in order to generate an internal voltage which is necessary for an internal circuit operation. The voltages required to operate the internal circuit of the semiconductor memory device can be classified into a core voltage VCORE which is supplied to a memory core region, a high voltage VPP which is used for driving a word line or used for overdriving and a back bias voltage VBB which is supplied to a bulk in which an NMOS transistor is provided in the memory core region.

Here, the core voltage VCORE is created by a voltage drop of the power supply voltage VDD to a predetermined level. However, since the high voltage VPP is higher than the power supply voltage VDD and the back bias voltage VBB is lower than the power supply voltage VDD, a charge pumping circuit is needed to create the high voltage VPP and the back bias voltage VBB.

FIG. 1 is a diagram illustrating a conventional core voltage generating circuit.

As shown in FIG. 1, the conventional core voltage generating circuit drives the core voltage VCORE in response to an enable signal LDVDL which is activated when a bank is enabled. That is, when the bank is enabled, the enable signal LDVDL is at a high level so that an NMOS transistor N16 in a comparator 12 is turned on and a PMOS transistor P14 in an internal voltage driver 14 is turned off. If the NMOS transistor N16 is turned on, the comparator 12 is enabled so that a division signal VA and a reference voltage VREFC are differentially amplified to generate a driving signal VB. At this time, the core voltage VCORE is divided to generate the division signal VA of a division signal generating unit 10. The level of the driving signal VB output from Node nd12 becomes low since an NMOS transistor N12 is more turned on than an NMOS transistor N14 when the division signal VA is lower than the reference voltage VREFC. The driving signal VB of a low level turns on a PMOS transistor P15 to drive the core voltage VCORE by supplying the power supply voltage VDD. The driving of the core voltage VCORE is continued until the level of the division signal VA is the same as that of the reference voltage VREFC.

The current drivability of the PMOS transistor P15, which operates as a driver for driving the core voltage VCORE, deteriorates when the level of the power supply voltage VDD is low. Thus, the core voltage VCORE is not driven to a desired voltage level when the power supply voltage VDD is at a low level. Therefore, a low-threshold voltage transistor is employed to prevent the drivability of the PMOS transistor P15 from being reduced when the power supply voltage VDD is in a low.

The driver using the transistor having a low-threshold voltage has an advantage in that a current drivability can be increased, but has a disadvantage in that a leakage current can be caused. That is, although the core voltage VCORE is driven to a desired voltage level so that the transistor included in the driver is turned off, a leakage current flows from the power supply voltage VDD to the core voltage VCORE because the threshold voltage of the turned-off transistor is low. The leakage current raises the level of the core voltage VCORE to a level exceeding the desired voltage level.

BRIEF SUMMARY

The present disclosure describes examples and exemplary embodiments of an internal voltage generation circuit capable of controlling the current drivability of a driver included therein, improving the drivability of the driver based on the drivability of the internal voltage driving circuit, and reducing the leakage current flowing through the driver.

According to an aspect of the present disclosure, a threshold voltage control circuit is provided comprising a first voltage supplying unit for supplying a first power supply voltage, in response to an enable signal which is activated when a bank is enabled, as a back bias voltage of a first MOS transistor, wherein the first MOS transistor drives an internal voltage, and a second voltage supplying unit for supplying a second power supply voltage, in response to the enable signal, as the back bias voltage of the first MOS transistor. The first voltage supplying unit includes a second MOS transistor which is connected between the first power supply voltage and an input terminal of the back bias voltage of the first MOS transistor and is turned on in response to an inverted signal of the enable signal. The second MOS transistor is a PMOS transistor and the first power supply voltage is an external voltage. The second voltage supplying unit includes a third MOS transistor which is connected between the second power supply voltage and the input terminal of the back bias voltage of the first MOS transistor and is turned on in response to the enable signal. The third MOS transistor is a PMOS transistor, the second power supply voltage is a high voltage, and the first MOS transistor is a PMOS transistor.

In another aspect of the present disclosure, there is provided an internal voltage generating circuit comprising a voltage divider for dividing an internal voltage in order to generate a division signal, a comparator for comparing a reference voltage with the division signal in response to an enable signal activated when a bank is enabled, an internal voltage driver for driving the internal voltage in response to the driving signal, and a threshold voltage controller for controlling a drivability of the internal voltage driver in response to the enable signal. The internal voltage driver includes a first MOS transistor which drives the internal voltage. The threshold voltage controller includes a first voltage supplying unit for supplying a first power supply voltage, in response to the enable signal, as a back bias voltage of the first MOS transistor, and a second voltage supplying unit for supplying a second power supply voltage, in response to the enable signal, as the back bias voltage of the first MOS transistor.

DESCRIPTION OF EXEMPLARY EMBODIMENTS

Hereinafter, the present invention will be described through examples and exemplary embodiments. The examples and exemplary embodiments are merely provided to exemplify application of the present invention, and the scope of the present disclosure and the appended claims is not limited by them.

Figure 1:
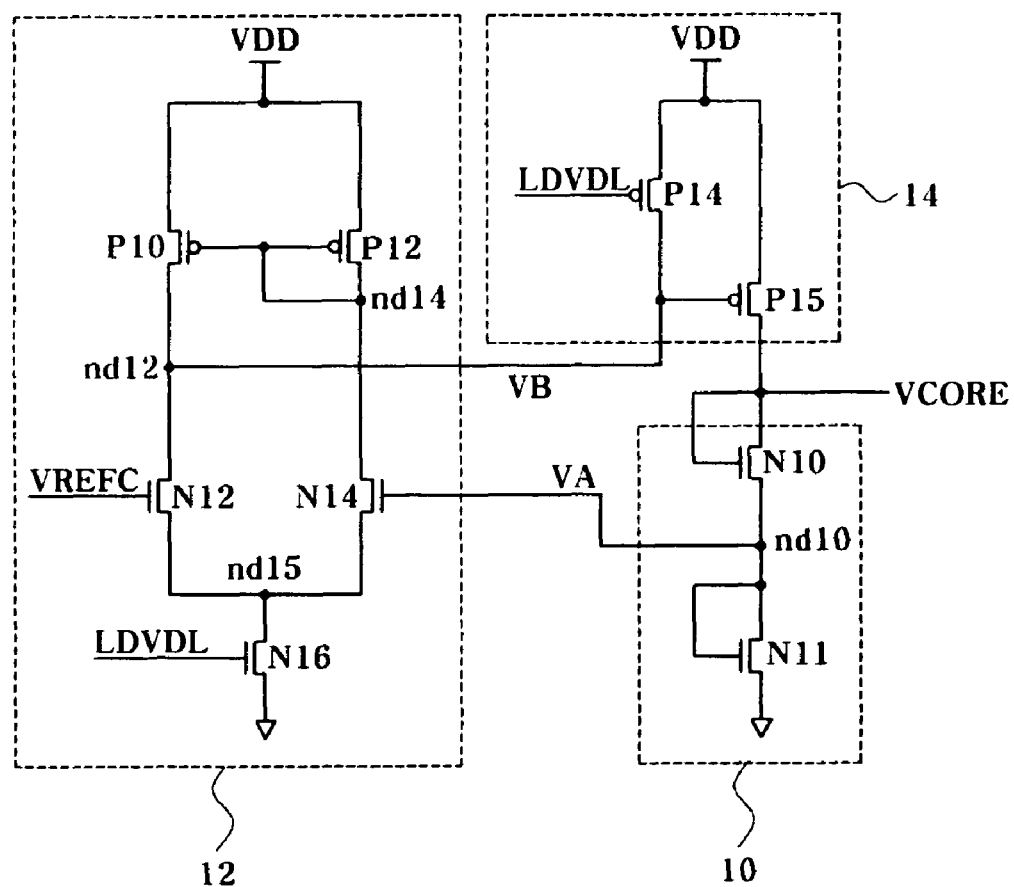
FIG. 1 is a circuit diagram illustrating a conventional core voltage generating circuit.
Figure 2:
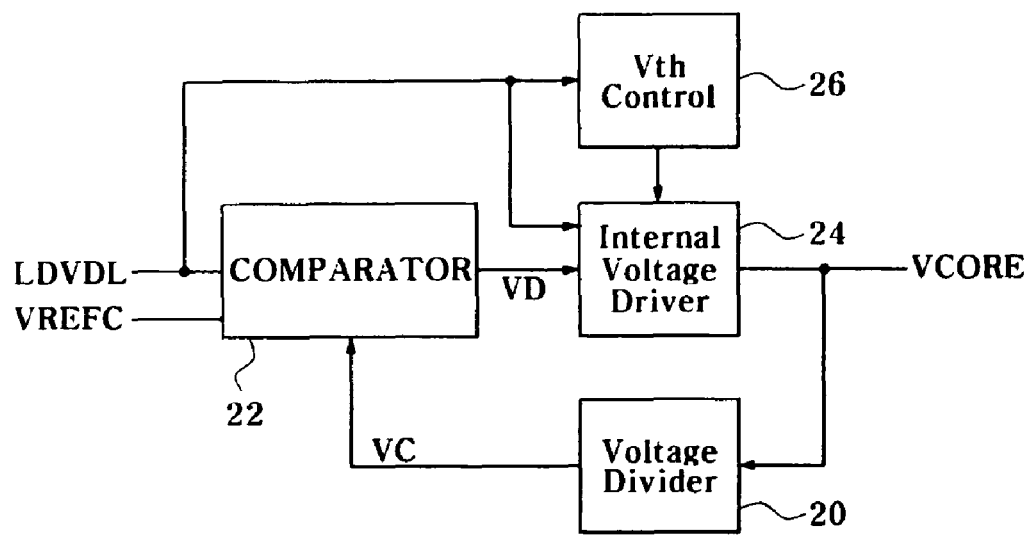
FIG. 2 is a block diagram illustrating a core voltage generating circuit according to an exemplary embodiment of the present disclosure.
Figure 3:
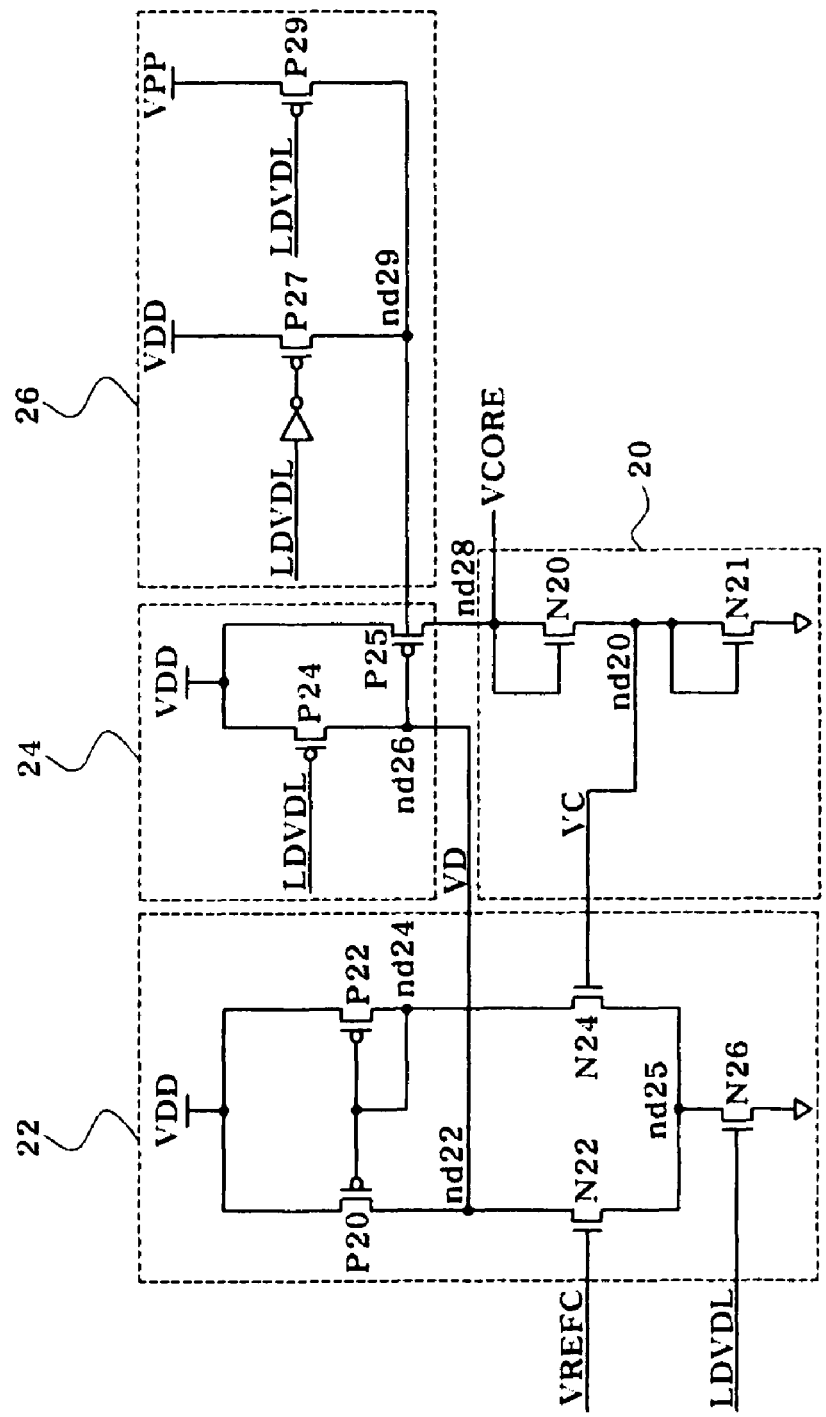
FIG. 3 is a detailed circuit diagram of the core voltage generating circuit of FIG. 2.

FIG. 2 is a block diagram illustrating a core voltage generating circuit according to an exemplary embodiment of the present disclosure and FIG. 3 is a detailed circuit diagram of the core voltage generating circuit of FIG. 2

First, a core voltage generating circuit according to an exemplary embodiment of the present disclosure, as shown in FIG. 2, includes a voltage divider 20 for dividing a core voltage VCORE in order to generate a division signal VC, a comparator 22 for comparing a reference voltage VREFC with the division signal VC in response to an enable signal LDVDL, which is activated when a bank is enabled, to generate a driving signal VD, an internal voltage driver 24 for driving the core voltage VCORE in response to the driving signal VD, and a threshold voltage controller 26 for controlling a current drivability of the internal voltage driver 24 in response to the enable signal LDVDL.

Referring to FIG. 3, the voltage divider 20 includes an NMOS transistor N20 which is connected between Node nd20 and Node nd28 and is turned on in response to a signal on Node nd28 and an NMOS transistor N21 which is connected between Node nd20 and a ground voltage VSS and is turned on in response to a signal on Node nd20. The NMOS transistors N20 and N21 divide the core voltage VCORE based on the turn-on resistance values thereof such that the division signal VC is produced by the voltage division of the core voltage VCORE. The NMOS transistors N20 and N21 can be resistance elements according to another exemplary embodiment of the present disclosure.

The comparator 22 includes a differential amplifier circuit and operates in response to the enable signal LDVDL. That is, the comparator 22 includes an NMOS transistor N22 which receives the reference voltage VREFC, an NMOS transistor N24 which receives the division signal VC, PMOS transistors P20 and P22 which form a current mirror, and an NMOS transistor N26 which is connected between Node nd25 and the ground voltage VSS and is turned on in response to the enable signal LDVDL. In case that the enable signal LDVDL of a high level is input, the comparator 22 performs a differential amplification. If the voltage level of the division signal VC is higher than the reference voltage VREFC, the driving signal VD is generated at a high level, and if the voltage level of the division signal VC is lower than the reference voltage VREFC, the driving signal VD is generated at a low level.

The internal voltage driver 24 includes a PMOS transistor P24 which is connected between a power supply voltage VDD and Node nd26 and is turned on in response to the enable signal LDVDL and a PMOS transistor P25 which is connected between the power supply voltage VDD and Node nd28 and is turned on in response to the driving signal VD. If the PMOS transistor P24 is turned off, the PMOS transistor. P25, which drives the core voltage VCORE, operates.

The threshold voltage controller 26 includes a PMOS transistor P27 which is connected between the power supply voltage VDD and Node nd29 and is turned on in response to an inverted signal of the enable signal LDVDL and a PMOS transistor P29 which is connected between a high voltage VPP and Node nd29 and is turned on in response to the enable signal LDVDL. Node nd29 is connected to an input terminal of the PMOS transistor P25 for input of a back bias voltage VBB, in the internal voltage driver 24. Here, if the level of the back bias voltage VBB input through Node nd29 is low, the level of the threshold voltage of the PMOS transistor P25 is low, and if the level of the back bias voltage VBB input through Node nd29 is high, the level of the threshold voltage of the PMOS transistor P25 is high.

Figure 4:
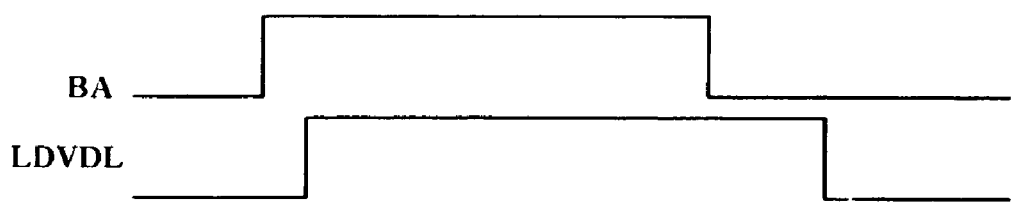
FIG. 4 is a timing view of an enable signal in the circuit of FIG. 3.

The operation of the circuit for generating the core voltage VCORE will be described referring to FIGS. 3 and 4.

The circuit for generating the core voltage VCORE operates in response to the enable signal LDVDL. As shown in FIG. 4, the enable signal LDVDL is activated to a high level with the lapse of a predetermined delay time after a bank access signal BA is activated to a high level when the bank is enabled.

First, the operation will be described when the bank is enabled. The enable signal LDVDL is activated to a high level, as described above. The enable signal LDVDL of a high level turns on the NMOS transistor N26 of the comparator 22 and turns off the PMOS transistor P24 of the internal voltage driver 24. Thus, the comparator 22 differentially amplifies a voltage difference between the division signal VC generated through the voltage divider 20 and the reference voltage VREFC in order to generate the driving signal VD. If the level of the division signal VC is higher than that of the reference voltage VREFC, the driving signal VD is generated at a high level, and if the level of the division signal VC is lower than that of the reference voltage VREFC, the driving signal VD is generated at a low level.

The driving signal VD is applied to the PMOS transistor P25 and drives the core voltage VCORE by using the power supply voltage VDD. That is, the PMOS transistor P25 is turned on by the driving signal VD of a low level, which is generated when the level of the division signal VC is lower than that of the reference voltage VREFC, and a charge is supplied from the power supply voltage VDD to the core voltage VCORE.

At this time, since the enable signal LDVDL of a high level turns on the PMOS transistor P27 in the threshold voltage controller 26 and turns off the PMOS transistor P29 in the threshold voltage controller 26, the power supply voltage VDD is supplied to the PMOS transistor P25 as the back bias voltage VBB. Since the level of the power supply voltage VDD is relatively lower than that of the high voltage VPP, the level of the threshold voltage of the PMOS transistor P25 to which the power supply voltage VDD is supplied as the back bias voltage VBB is relatively low. When the level of the threshold voltage of the PMOS transistor P25 becomes low, the current drivability of the PMOS transistor P25, which deteriorates due to the low level of the power supply voltage VDD, is supplemented. That is, although the current drivability of the PMOS transistor P25 deteriorates due to the low level of the power supply voltage VDD, the PMOS transistor P25, having the threshold voltage which becomes low by the threshold voltage controller 26, can easily supply the charges from the power supply voltage VDD to the core voltage VCORE. Therefore, the PMOS transistor P25 can drive the core voltage VCORE to a desired voltage level even if the level of the power supply voltage VDD is low.

Next, the operation will be described when the bank is not enabled. The enable signal LDVDL is activated at a low level, as described above. The enable signal LDVDL of a low level turns off the NMOS transistor N26 in the comparator 22 and turns on the PMOS transistor P24 in the internal voltage driver 24. Thus, the differential amplification by the comparator 22 is terminated, and the power supply voltage VDD is applied to the PMOS transistor P25 via the turned-on PMOS transistor P24 so that the PMOS transistor P25 is turned off. In a state where the PMOS transistor P25 is turned off, the driving of the core voltage VCORE is terminated.

At this time, since the enable signal LDVDL of a low level turns off the PMOS transistor P27 in the threshold voltage controller 26 and turns on the PMOS transistor P29 in the threshold voltage controller 26, the high voltage VPP is supplied to the PMOS transistor P25 as the back bias voltage VBB. Since the level of the high voltage VPP is relatively higher than that of the power supply voltage VDD, the threshold voltage of the PMOS transistor P25 to which the high voltage VPP is supplied as the back bias voltage VBB is relatively high. A leakage current, which is generated by the flow of the charges from the power supply voltage VDD to the core voltage VCORE, can be remarkably reduced because the turned-off PMOS transistor P25 has the threshold voltage at a high level.

The circuit for generating the core voltage VCORE according to the above-described exemplary embodiment of the present disclosure supplements the current drivability of the PMOS transistor P25 by lowering the threshold voltage of the PMOS transistor P25 which drives the core voltage VCORE when the bank is enabled so that the core voltage VCORE is driven to i desired voltage level even when the level of the power supply voltage VDD is low. Meanwhile, when the bank is not enabled, the circuit for generating the core voltage VCORE raises the threshold voltage of the PMOS transistor P25 which drives the core voltage VCORE so that the leakage current, which is generated through the PMOS transistor P25 to terminate the driving of the core voltage VCORE, is reduced.

The circuit for generating the core voltage VCORE according to the exemplary embodiment of FIG. 3 supplies the power supply voltage VDD or the high voltage VPP as the back bias voltage VBB of the PMOS transistor P25 based on whether the bank is enabled. The high voltage VPP and the back bias voltage VBB used in the exemplary embodiment, which control the threshold voltage of the PMOS transistor P25 driving the core voltage VCORE, can be replaced with different kinds of voltages.

While the present invention has been described with respect to examples and exemplary embodiments, it will be apparent to those skilled in the art that various changes and modifications may be made without departing from the spirit and scope of the disclosure and the following claims.

The present disclosure claims priority to Korean application number 10-2007-0109124, filed on Oct. 29, 2007, the entire contents of which are incorporated herein by reference.

What is claimed is:

1. A threshold voltage control circuit comprising:
   a first voltage supplying unit configured to receive an enable signal which is activated when a bank is enabled, and configured to supply a first power supply voltage, as a back bias voltage of a first MOS transistor, wherein the first MOS transistor drives an internal voltage;
   an inverter configured to receive the enable signal; and
   a second voltage supplying unit configured to receive an output signal of the inverter and supply a second power supply voltage, as the back bias voltage of the first MOS transistor.

2. The threshold voltage control circuit of claim 1, wherein the first voltage supplying unit includes a second MOS transistor which is connected between the first power supply voltage and an input terminal of the first MOS transistor, for input of the back bias voltage, and is turned on in response to an inverted signal of the enable signal.

3. The threshold voltage control circuit of claim 2, wherein the second MOS transistor is a PMOS transistor.

4. The threshold voltage control circuit of claim 2, wherein the second voltage supplying unit includes a third MOS transistor which is connected between the second power supply voltage and the input terminal for the input of the back bias voltage of the first MOS transistor, and is turned on in response to the enable signal.

5. The threshold voltage control circuit of claim 4, wherein the third MOS transistor is a PMOS transistor.

6. The threshold voltage control circuit of claim 1, wherein the first power supply voltage is an external voltage.

7. The threshold voltage control circuit of claim 1, wherein the second power supply voltage is a high voltage.

8. The threshold voltage control circuit of claim 1, wherein the first MOS transistor is a PMOS transistor.

9. An internal voltage generating circuit comprising:
   a voltage divider for dividing an internal voltage in order to generate a division signal;
   a comparator for comparing a reference voltage with the division signal in response to an enable signal activated when a bank is enabled in order to generate a driving signal;
   an internal voltage driver configured to drive the internal voltage in response to the driving signal, the internal voltage driver comprising a first MOS transistor which drives the internal voltage;
   a first voltage supplying unit configured to receive an enable signal which is activated when a bank is enabled, and supply a first power supply voltage, as a back bias voltage of the first MOS transistor, wherein the first MOS transistor drive an internal voltage;
   an inverter configured to receive the enable signal; and
   a second voltage supplying unit configured to receive an output signal of the inverter and supply a second power supply voltage, as the back bias voltage of the first MOS transistor.

10. The internal voltage generating circuit of claim 9, wherein the first voltage supplying unit includes a second MOS transistor which is connected between the first power supply voltage and an input terminal of the first MOS transistor for input of the back bias voltage and is turned on in response to an inverted signal of the enable signal.

11. The threshold voltage control circuit of claim 10, wherein the second MOS transistor is a PMOS transistor.

12. The threshold voltage control circuit of claim 9, wherein the first power supply voltage is an external voltage.

13. The threshold voltage control circuit of claim 9, wherein the second voltage supplying unit includes a third MOS transistor which is connected between the second power supply voltage and the input terminal for the input of the back bias voltage of the first MOS transistor, and is turned on in response to the enable signal.

14. The threshold voltage control circuit of claim 13, wherein the third MOS transistor is a PMOS transistor.

15. The threshold voltage control circuit of claim 9, wherein the second power supply voltage is a high voltage.

16. The threshold voltage control circuit of claim 9, wherein the first MOS transistor is a PMOS transistor.

* * * * *